United States Patent [19]
Clayton et al.

[11] Patent Number: 5,805,988
[45] Date of Patent: Sep. 8, 1998

[54] SYSTEM AND METHOD FOR SWITCHING AN RF SIGNAL BETWEEN MIXERS

[75] Inventors: Kenneth Wilson Clayton, Plano; Robert Rudolf Rotzoll, Allen, both of Tex.

[73] Assignee: Microtune, Inc., Plano, Tex.

[21] Appl. No.: 577,889

[22] Filed: Dec. 22, 1995

[51] Int. Cl.$^6$ .................................................. H04B 1/26
[52] U.S. Cl. .................. 455/333; 455/150.1; 455/189.1; 455/252.1
[58] Field of Search .............................. 455/189.1, 240.1, 455/241.1, 245.2, 251.1, 253.2, 313, 333, 295, 311, 323, 150.1, 188.1, 250.1; 327/355, 551

[56] References Cited

U.S. PATENT DOCUMENTS

| | | | |
|---|---|---|---|
| 4,458,210 | 7/1984 | Horl | 330/254 |
| 4,480,337 | 10/1984 | Graziadei et al. | 455/333 |
| 4,695,940 | 9/1987 | Rein | 363/157 |
| 4,912,520 | 3/1990 | Yamamoto et al. | 455/333 |
| 4,931,746 | 6/1990 | Tränkle et al. | 330/254 |
| 5,303,417 | 4/1994 | Laws | 455/314 |
| 5,355,534 | 10/1994 | Kimura | 455/323 |
| 5,379,457 | 1/1995 | Nguyen | 455/323 |
| 5,448,772 | 9/1995 | Grandfield | 455/333 |
| 5,548,840 | 8/1996 | Heck | 455/326 |
| 5,589,791 | 12/1996 | Gilbert | 327/359 |
| 5,604,927 | 2/1997 | Moore | 455/266 |
| 5,630,228 | 5/1997 | Mittel | 455/326 |

OTHER PUBLICATIONS

Meyer, Robert G. and William D. Mack "A 1–Ghz BiCMOS RF Front–End IC," IEEE Journal of Solid–State Circuits, IEEE, Piscataway, NJ, vol. 29, No. 3, Mar. 1994, pp.350–355.

Scheinberg, N. and R. Michels at al. "A GaAs Upconverter Integrated Circuit for a Double Conversion Cable TV Set–Top Tuner," IEEE Journal of Solid State Circuits, IEEE, Piscatawy, NJ, vol. 29, No. 6, Jun. 1994, pp. 688–692.

"A Highly Integrated Two Channel MMIC Down Converter with Gain Control", Staudinger et al, IEEE, pp. 11–14, Jun. 1989.

"A Double Balanced 3–18 GHZ Resistive HEMT Monolithic Mixer", Chen et al, IEEE, pp. 167–170, May 1992.

*Primary Examiner*—Tommy P. Chin
*Assistant Examiner*—Vu Le
*Attorney, Agent, or Firm*—Fulbright & Jaworski L.L.P.

[57] ABSTRACT

The system and method for switching a radio frequency (RF) signal between mixers can provide a large automatic gain control (AGC) range while maintaining low noise levels by using a switching circuit to select between at least two mixers that are switched between a common load using reverse biasing. To turn off a specific mixer, RF inputs to that mixer are reverse biased, which shuts off the current to the load. The full AGC of the switching circuit is approximately the sum of the AGC of each mixer. Each mixer has a limited AGC range, which limits the amount of current swing needed for the full AGC of the switching circuit. By dividing the switching circuit between two or more mixers, the transistor devices in each mixer may be sized appropriately with respect to the current levels being used in each mixer. For instance, in a mixer designed specifically for low noise applications, the transistor devices can be very large. For a mixer that is designed to tolerate more noise, the transistor devices may be smaller, which allows more precise tailoring of the ft of the particular mixer. These two mixers may be coupled together in the system and method of switching an RF signal between mixers to obtain the individual benefits of each mixer.

18 Claims, 2 Drawing Sheets

SYSTEM AND METHOD FOR SWITCHING AN RF SIGNAL BETWEEN MIXERS

BACKGROUND OF THE INVENTION

1. Technical Field of the Invention

This invention relates radio frequency (RF) signal switching. More specifically, this invention relates to a system and method for switching RF signals between two or more mixers.

2. Discussion of the Related Technology

An automatic gain control (AGC) signal is a voltage that controls the gain of a mixer in order to reduce the dynamic range of the mixer output. For instance, if a very low level input RF voltage signal enters a mixer, the gain on the mixer should be increased to obtain maximum amplification of the low level input. In operation, the AGC voltage should increase current through the mixer to obtain a suitable amplified output. In contrast, if a very large input RF voltage signal enters the mixer, the gain of the mixer should be decreased. Thus, the AGC voltage should cause the current in the mixer to decrease and minimize amplification.

In conventional mixers, in order to achieve a 30 dB gain range, current through the mixer must be varied dramatically. For example, to achieve a 30 dB AGC range in a conventional mixer, the current in the mixer must be varied over a 32 to 1 ratio. Additionally, at low current, the unity current gain frequency (ft) of a transistor is reduced significantly. This ft reduction causes a large gain difference over the RF input range, which includes 50 megahertz to 900 megahertz.

Conventional mixers having no emitter degeneration encounter significant distortion and intermodulation when large RF input voltages are applied. The addition of emitter degeneration improves the distortion characteristics of the mixer, but emitter degeneration adds noise to the RF signal. While extra noise may be tolerated under large RF input signal conditions, it is usually not acceptable under low input signal conditions.

It would be advantageous to limit the bias current variation in a mixer to produce a more acceptable ft performance. It would also be advantageous to provide emitter degeneration under large RF signal conditions but not under small RF signal conditions.

SUMMARY OF THE INVENTION

The system and method for switching an RF signal between mixers can provide a 30 dB AGC range while maintaining low noise and low intermodulation levels by using a switching circuit to select between at least two mixers that are switched between a common load using reverse biasing. To turn off a specific mixer, RF inputs to that mixer are reverse biased, which shuts off the current to the load. The full AGC of the switching circuit is approximately the sum of the AGC of each mixer. Each mixer has a limited AGC range, which limits the amount of current swing needed for full AGC. By dividing the switching circuit between two or more mixers, the transistor devices in each mixer may be sized appropriately with respect to the current levels being used in each mixer. For instance, in a mixer designed specifically for low noise applications, the transistor devices can be very large. For a mixer that is designed to tolerate more noise, the transistor devices may be smaller, which allows more precise tailoring of the ft of the particular mixer. These two mixers may then be coupled together in the system and method of switching an RF signal between mixers to obtain the benefits of each mixer.

One advantage of using this system is that the system produces a flat gain across the input range, yet maintains a wide AGC range. Another advantage of the system is that the noise performance of the system can be tailored to the particular gain range desired. Another advantage of the system is that one mixer circuit can be tailored for low noise situations, while another mixer circuit can be tailored for high input signal situations.

The foregoing description broadly outlined the features and technical advantages of the present invention in order that the detailed description of the invention that follows may be better understood. Additional features and advantages of the invention, which form the subject of the claims of the invention, will be described later. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is made to the following descriptions taken in conjunction with the accompanying drawings.

DETAILED DESCRIPTION OF THE PREFERRED EMBODIMENT

Figure 1:
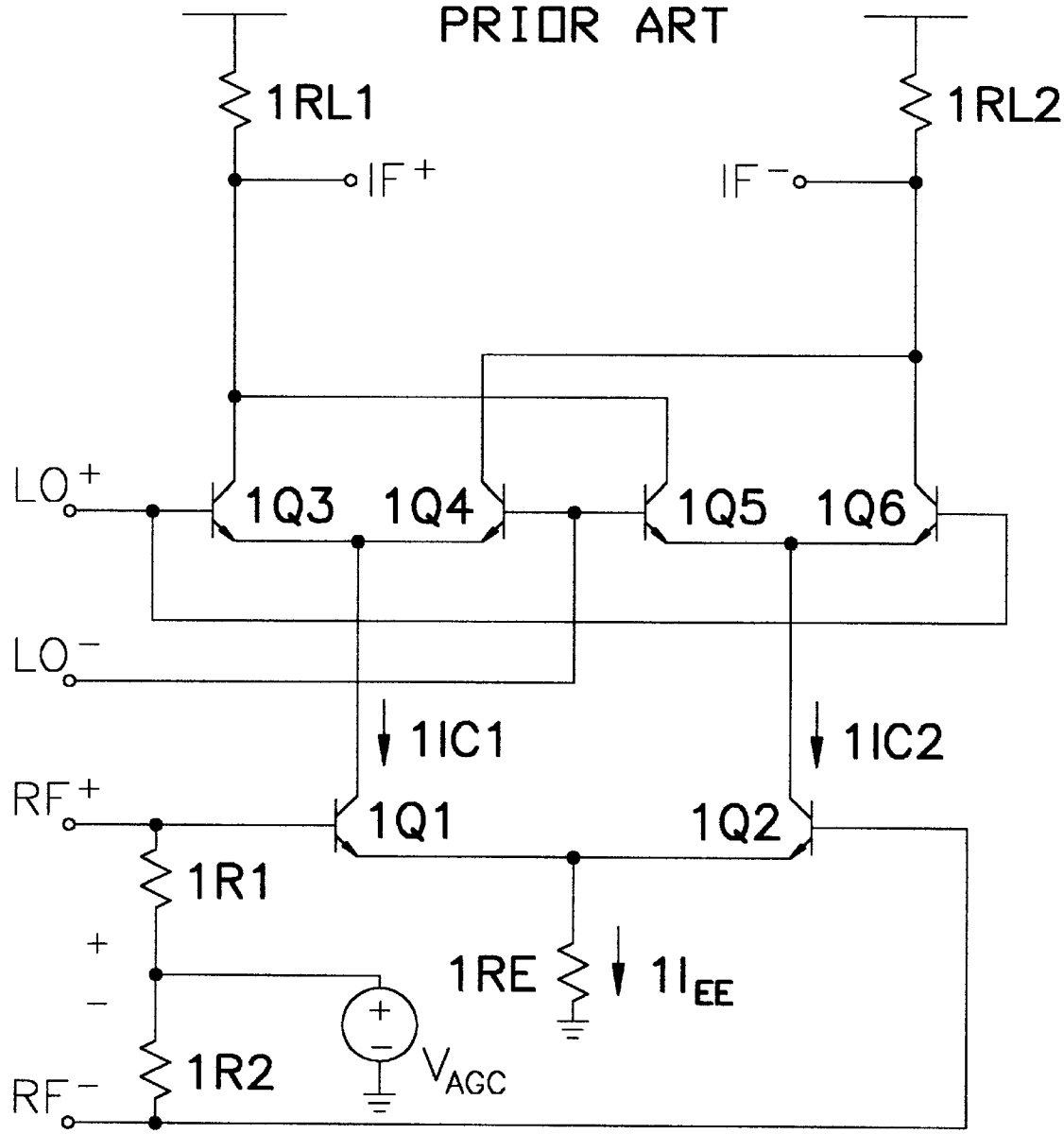
FIG. 1 shows a circuit diagram of a prior art Gilbert-style mixer.

FIG. 1 shows a circuit diagram of a prior art Gilbert-style mixer. This mixer has three main sections: the transconductance amplifier, the LO switches, and the load resistors. The transconductance amplifier includes transistors 1Q1, 1Q2 and resistor 1RE. This amplifier converts an RF input voltage to currents 1IC1 and 1IC2. The LO switches include transistors 1Q3, 1Q4, 1Q5, and 1Q6. These transistors switch the currents 1IC1 and 1IC2 between the IF mixer output. This provides mixing action between the LO and RF inputs. The load resistors 1RL1, 1RL2 convert the switched currents to voltage.

Variable gain is accomplished in the prior art Gilbert-style mixer by applying a common mode voltage to the RF inputs. This common mode voltage $V_{AGC}$ across resistances 1R1, 1R2, in conjunction with resistor 1RE, determines the current $1I_{EE}$. The gain gm of the transconductance amplifier driving the load resistors 1RL1, 1RL2 is directly proportional to $1I_{EE}$ according to the following equation:

$$gm = 1I_{EE}/V_T = (V_{AGC} - V_{BE})/(1RE*V_T)$$

where $V_T$ is the thermal voltage kT/q and $V_{BE}$ is the base-emitter voltage of transistors 1Q1, 1Q2.

The prior art Gilbert-style mixer shown in FIG. 1 has several problems including intermodulation distortion and gain flatness at low gain. When distortion is improved by emitter degeneration, noise figure suffers. Noise figure is important for conditions in which low level signals are applied to the RF input. Under this condition, the AGC voltage $V_{AGC}$ causes the gain of the mixer to maximize ($1I_{EE}$=maximum). A large $1I_{EE}$ helps reduce the noise added to a low level RF input signal by the mixer itself. The limit of the maximum $1I_{EE}$ is dictated by collector resistance, ft, and electromigration limits of the transistors used in the circuit. Another mechanism designed to minimize noise added to a low level RF input signal is making the mixer transistors very large. Large transistors have lower base and emitter resistance, both of which can contribute significantly to added noise.

Intermodulation distortion is important for conditions in which high level signals are applied to the RF input. Under this condition, the AGC voltage $V_{AGC}$ causes the mixer gain to minimize ($1I_{EE}$=minimum). Emitter degeneration is needed to increase the RF input range the mixer can handle, thus reducing intermodulation distortion. Degeneration, however, increases the mixer noise figure.

Gain flatness over the input RF frequency range becomes worse as $1I_{EE}$ decreases due to the reduction in a transistor's ft. The ft is the frequency at which a transistor's AC beta is unity. Below ft the AC beta is greater than one; above ft the AC beta is less that one. As a transistor's bias current is reduced, ft moves from a very high frequency to frequencies close to or within the RF input frequency range. To achieve a 30 dB AGC range, the bias current $1I_{EE}$ must change by a ratio of 32 to 1, causing dramatic shifts in ft. The shift in ft affects 1Q1 and 1Q2 minimally, because they are driven by a low impedance voltage source. However, LO switching transistors 1Q3, 1Q4, 1Q5, 1Q6 are affected severely, because these transistors are current source driven. If the AC beta of these transistors is reduced, then AC current is diverted from the load resistors and the mixer gain is reduced.

Figure 2:
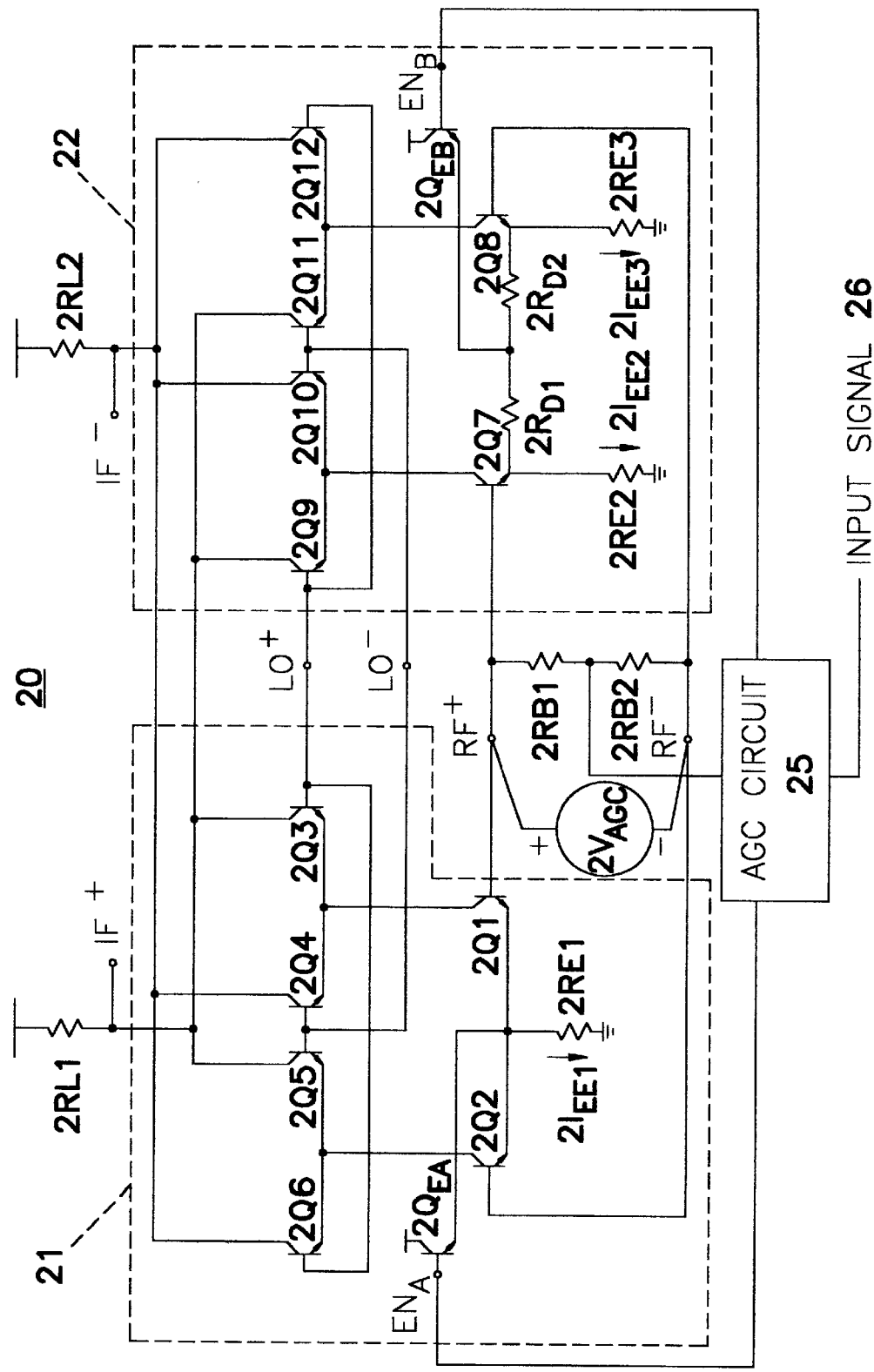
FIG. 2 shows a circuit diagram of the preferred embodiment.

FIG. 2 shows a circuit diagram of the preferred embodiment. Switching circuit 20 has two separate mixers 21, 22 tied to a common load resistances 2RL1, 2RL2. The mixers 21, 22 satisfy the conflicting demands of noise figure and intermodulation for switching circuit 20. One mixer is constructed specifically to handle low level RF input signals and another mixer is constructed to handle high level RF input signals.

The mixers 21, 22 are switched on and off by separate enable signals $EN_A$ and $EN_B$. These enable signals are controlled by AGC circuit 25 having an input 26, such as a demodulated signal. A continuously variable AGC voltage is still applied to the switching circuit using a common mode voltage $2V_{AGC}$ over resistances 2RB1, 2RB2 on the RF inputs. In this particular embodiment, the AGC circuit 25 is a common AGC circuit that uses a technique known as "gated AGC." The switching circuit 20 differs from conventional AGC systems, in that it must decide which of the two or more mixers 21, 22 to turn on.

To switch mixer 21 off, enable voltage $EN_A$ is pulled up sufficiently to reverse bias the base-emitter junctions of transconductance amplifier transistors 2Q1, 2Q2. When these junctions are reverse biased, the collector currents of transistors 2Q1, 2Q2 go to zero and the mixer is turned off. Note that transistor $2Q_{EA}$ must be able to supply current $2I_{EE1}$ across resistor 2RE1 while the mixer is in the "off" state. Preferably transistor $2Q_{EA}$ is driven with a low impedance source so that voltage $EN_A$ may be pulled sufficiently high given power supply voltage constraints. To turn mixer 21 on, voltage $EN_A$ is dropped until the base-emitter junction of $2Q_{EA}$ is reverse biased. Once the transconductance amplifier of mixer 21 is on, LO switches 2Q3, 2Q4, 2Q5, and 2Q6 mix the LO and RF inputs to the IF output of mixer 21.

The switching of mixer 22 is similar to the switching of mixer 21. Enable signal $EN_B$ controls transistor $2Q_{EB}$ to turn on and turn off transconductance amplifier transistors 2Q7, 2Q8 of mixer 22. Currents $2I_{EE2}$, $2I_{EE3}$ across resistors $2R_{D1}$, $2R_{D2}$, 2RE2, and 2RE3 control the gain of the amplifier in mixer 22. When mixer 22 is on, LO switches 2Q9, 2Q10, 2Q11, and 2Q12 mix the LO and RF inputs to the IF output of mixer 22.

Each mixer 21, 22 is designed to cover half the total AGC range with some overlap. For instance, if the total desired AGC range is 30 dB, than each mixer 21, 22 could cover 15 dB plus an overlap of perhaps 3 dB. This arrangement would give an AGC range of 18 dB for each mixer, or a change in currents $2I_{EE1}$, $2I_{EE2}$, and $2I_{EE3}$, of 8 to 1. The advantage of reducing the AGC range of each mixer is that the transistors' ft does not change as much. In this manner, improved gain flatness over the input frequency range is achieved.

The transistors in each mixer can be sized to accommodate special needs. Mixer 21 transistors may be large to improve noise figure. The transistors of mixer 22 can be degenerated to improve intermodulation distortion. The bias currents of each mixer can be chosen to operate the transistors near their optimal ft.

The operation of the mixers 21, 22 can be mutually exclusive, but switching is not necessarily limited in this manner. In addition to the two-mixer technique shown in FIG. 2, this technique can be used for more than two mixers. For example, one mixer can be designed specifically for low-level RF inputs, another mixer can be designed for mid-level RF inputs, and a third mixer can be designed for high-level RF inputs, and a switching system can select between the three mixers according to the technique shown. This technique can also be used to switch two or more amplifiers with a common load.

Although the present invention and its advantages have been described in detail, it should be understood that various changes, substitutions, and alterations can be made without departing from the spirit and scope of the invention as defined by the appended claims.

We claim:

1. A circuit for switching between mixers comprising:
   (A) a first mixer comprising:
      (1) a first transconductance amplifier having a first transistor device, a second transistor device, and a radio frequency input terminal; and
      (2) a first enable switch connected to the first transconductance amplifier;
   (B) a second mixer comprising:
      (1) second transconductance amplifier having a first transistor device, a second transistor device, and radio frequency input terminal; and
      (2) a second enable switch connected to the second transconductance amplifier;
   (C) an LO switching circuit having a LO input terminal for switching between an output of the first mixer and an output of the second mixer; and
   (D) an automatic gain control circuit connected to the first enable switch and the second enable switch having a common load voltage connected to the radio frequency input terminal of the first transconductance amplifier and the radio frequency input terminal of the second transconductance amplifier.

2. A circuit for switching between mixers according to claim 1, wherein the first transistor device of the first mixer and the second transistor device of the first mixer have coupled emitters.

3. A circuit for switching between mixers according to claim 1, wherein the first transistor device of the second mixer and the second transistor device of the second mixer have coupled emitters.

4. A circuit for switching between mixers according to claim 1, wherein the first mixer and the second mixer are reverse biased.

5. A circuit for switching between mixers according to claim 1, wherein said first and second transistors in the first mixer are selected to reduce mixer noise.

6. A circuit for switching between mixers according to claim 1, wherein said first and second transistors in the second mixer are selected to limit the unity current gain frequency.

7. A circuit for switching between mixers according to claim 1, wherein an automatic gain control range of the first mixer is equal to an automatic gain control range of the second mixer.

8. A circuit for switching between mixers according to claim 1, wherein an automatic gain control range of the circuit is approximately equal to an automatic gain control range of the first mixer plus to an automatic gain control range of the second mixer.

9. A method for switching between mixers comprising the steps of:
   enabling a first transconductance amplifier of a first mixer having a common mode voltage input and a first enable transistor;
   disabling the first transconductance amplifier of the first mixer and enabling a second transconductance amplifier of a second mixer having the same common mode voltage input and a second enable transistor when the first and second mixers receive a specified input signal; and
   switching an output of said first mixer and an output of said second mixer, wherein said switching step is performed by LO switching circuits having LO input terminals;
   wherein said enabling and disabling steps are performed by an automatic gain control circuit coupled to said first and said second enable transistors and to said common mode voltage input.

10. A method for switching between mixers according to claim 9 wherein the step of enabling said first transconductance amplifier comprises reverse biasing the first enable transistor.

11. A method for switching between mixers according to claim 9 wherein the step of disabling comprises reverse biasing the second enable transistor.

12. A method for switching between mixers according to claim 9 further comprising the steps of:
   varying the common mode voltage input to vary a gain of the first mixer after the step of enabling.

13. A method for switching between mixers according to claim 9 further comprising the steps of:
   varying the common mode voltage input to vary a gain of the second mixer after the step of disabling.

14. A method for switching between mixers according to claim 9 wherein the specified input signal is an input signal having a low-level radio frequency voltage.

15. A method for switching between mixers according to claim 9 wherein the specified input signal is an input signal having a high-level radio frequency voltage.

16. A circuit for switching between mixers comprising:
   means for enabling a first transconductance amplifier of a first mixer having a common mode voltage input;
   automatic gain control means for disabling the first transconductance amplifier of the first mixer and enabling a second transconductance amplifier of a second mixer having the same common mode voltage inputs;
   LO switching means having an LO input terminal for switching an output of said first mixer and an output of said second mixer;
   wherein said automatic gain control means is connected to a first enable transistor of said first mixer and connected to a second enable transistor of said second mixer, said automatic gain control means also connected to said common mode voltage input.

17. A circuit for switching between mixers according to claim 16 further comprising:
   automatic gain control means for varying the common mode voltage input to vary a gain of the first mixer.

18. A circuit for switching between mixers according to claim 16 further comprising:
   automatic gain control means for varying the common mode voltage input to vary a gain of the second mixer.

* * * * *